Figure 1:
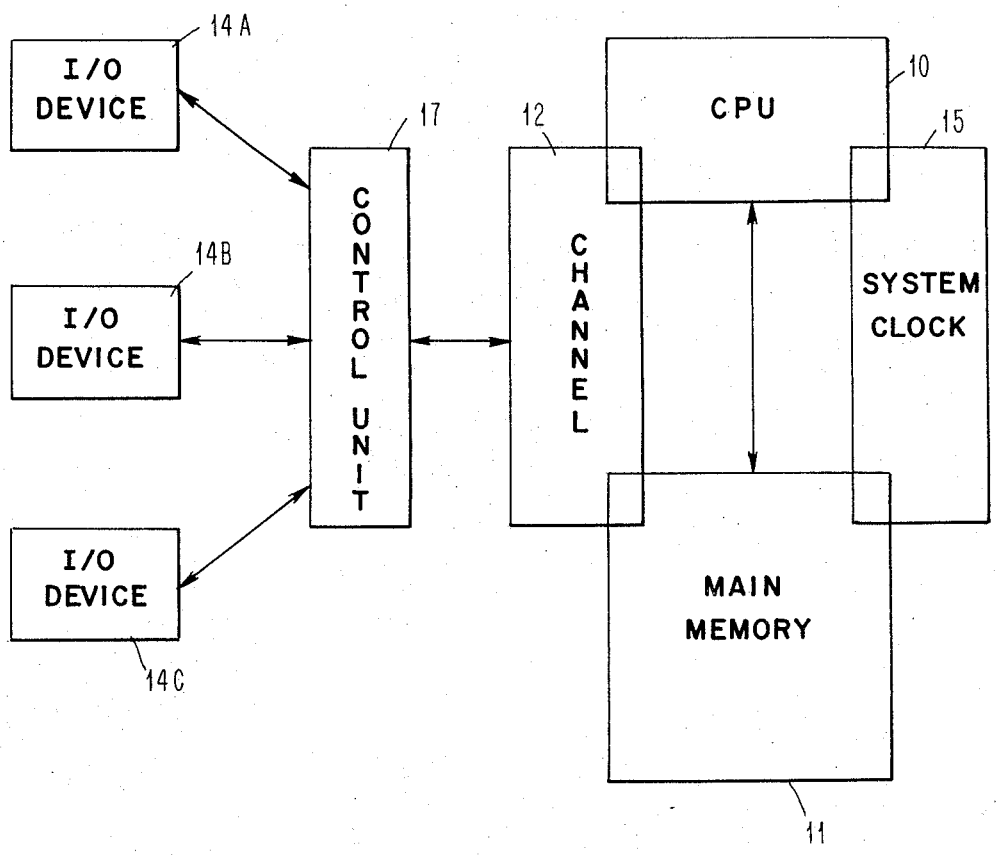
Figure 2:
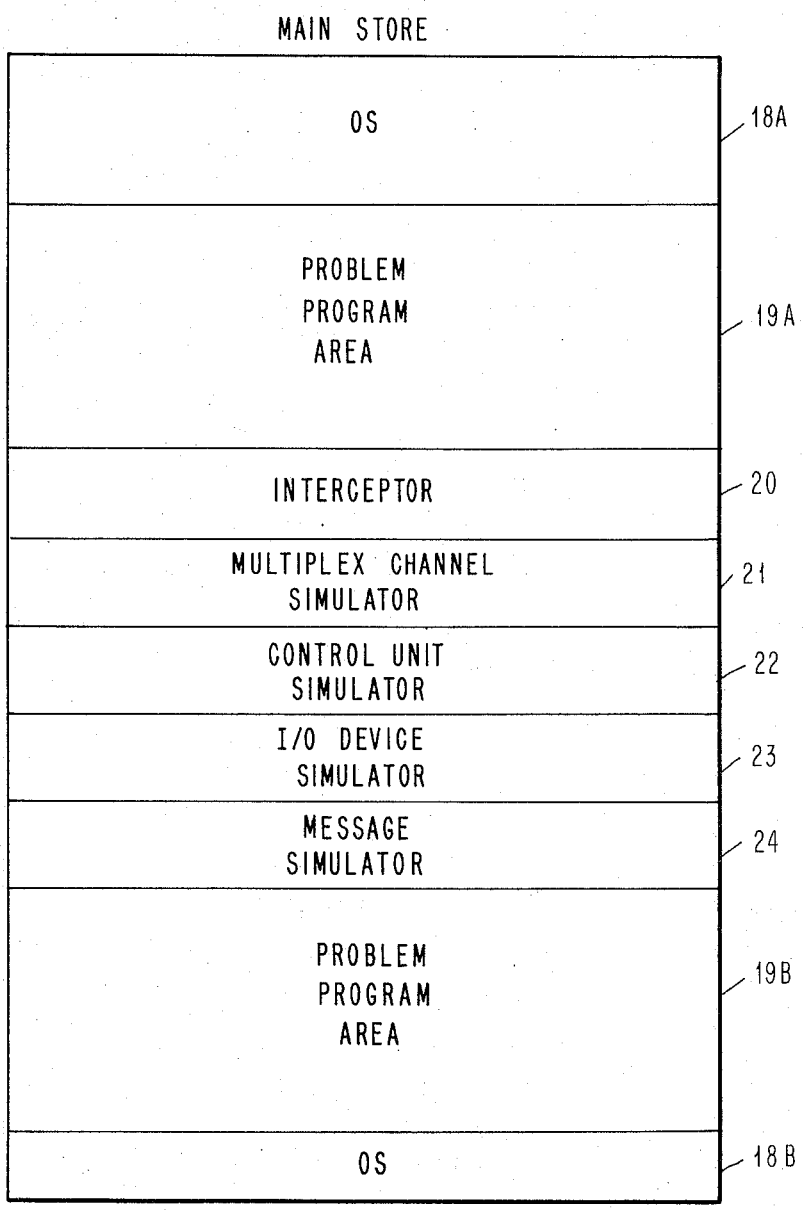
Figure 3A:
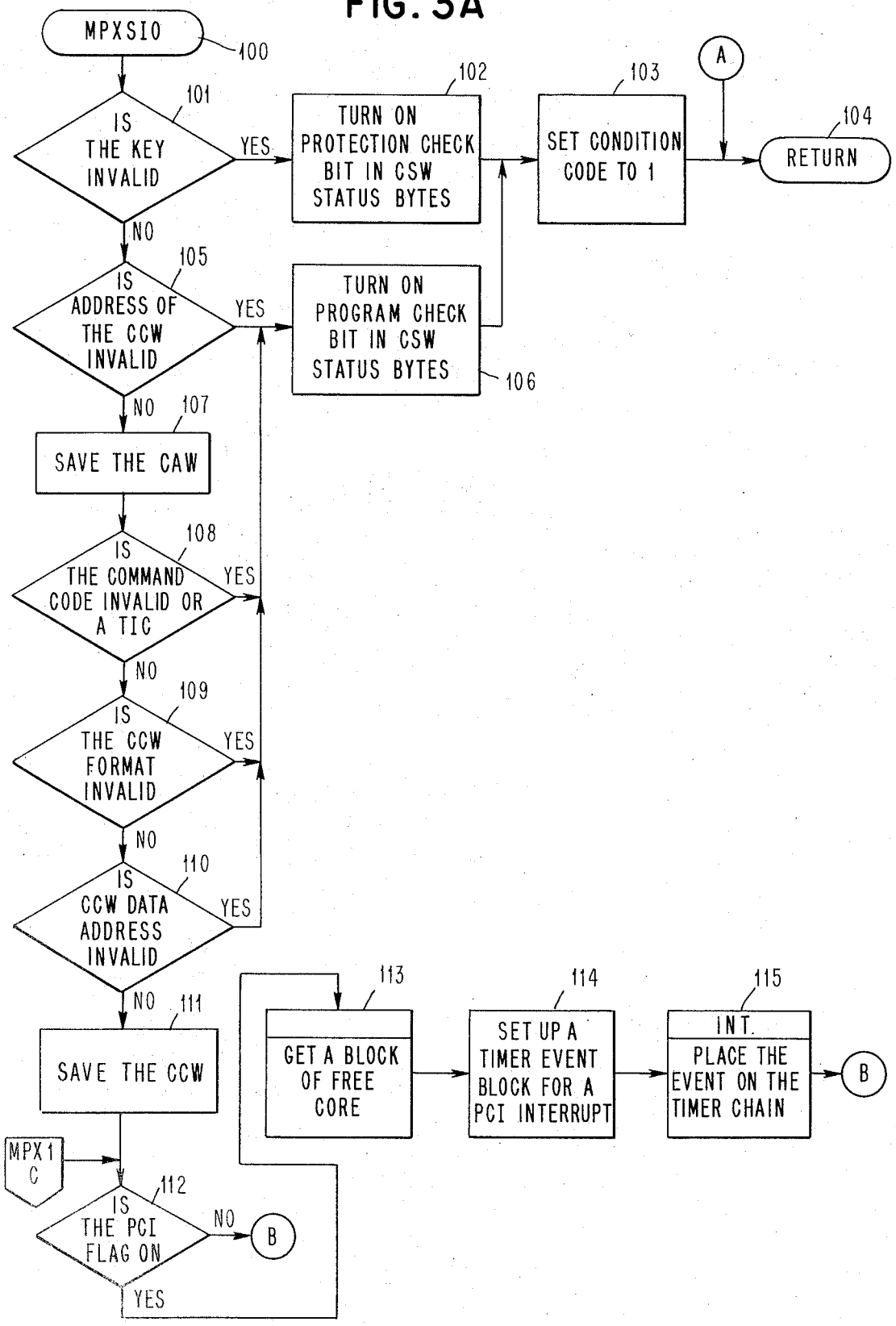
Figure 3B:
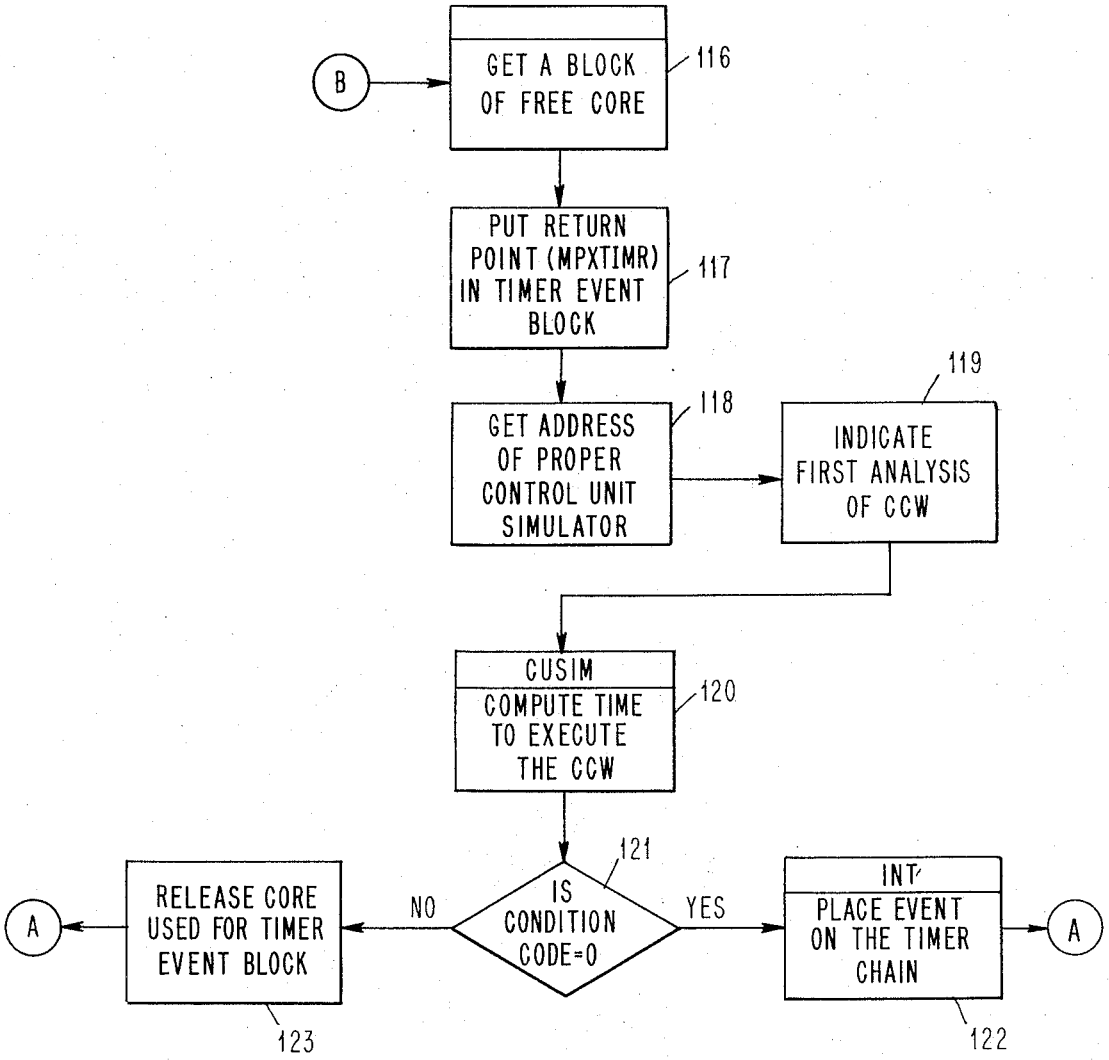
Figure 4A:
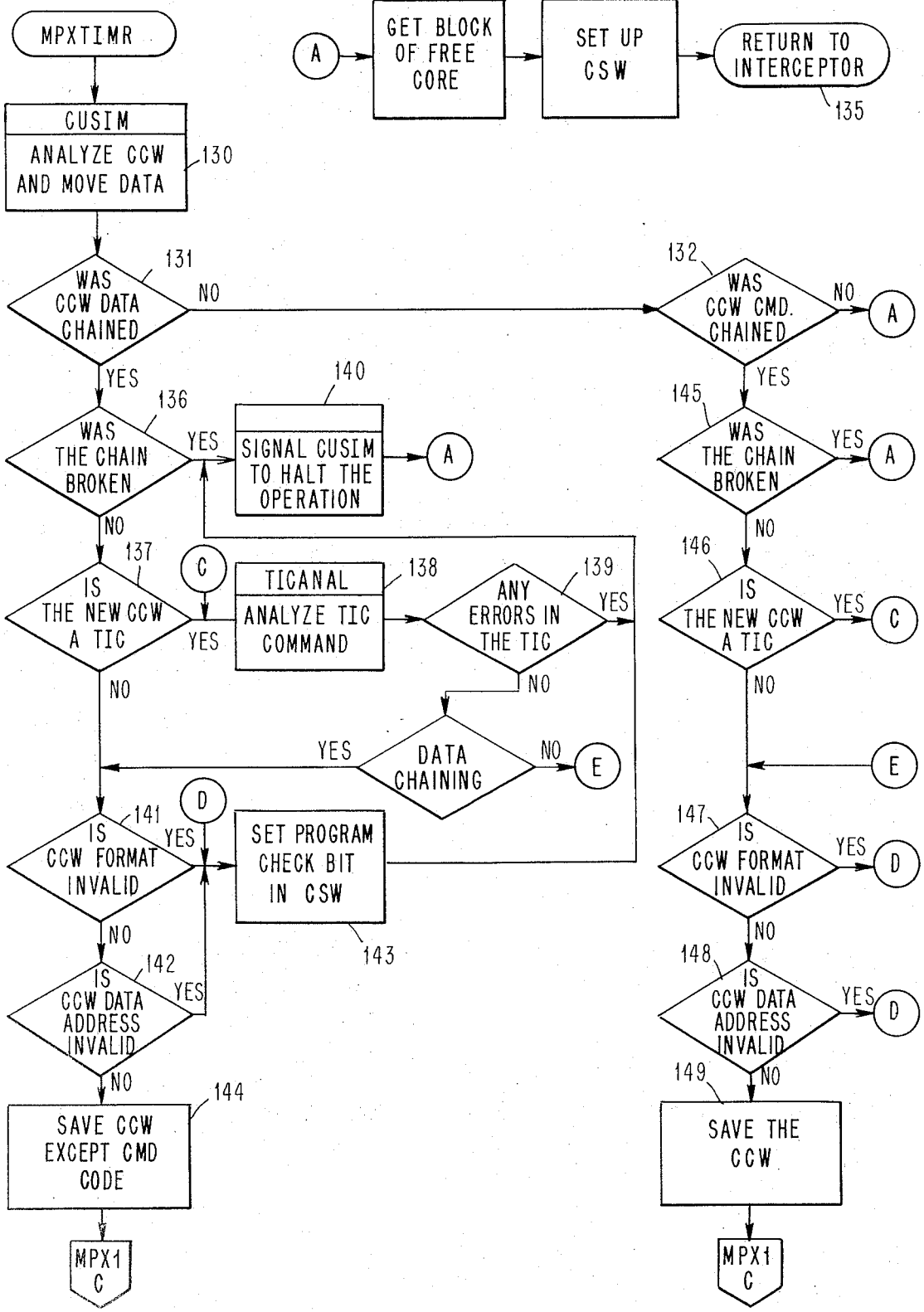
Figure 4B:
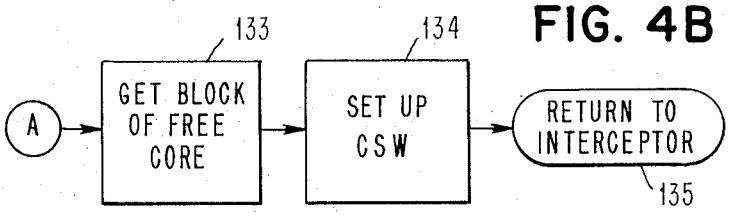
Figure 6:
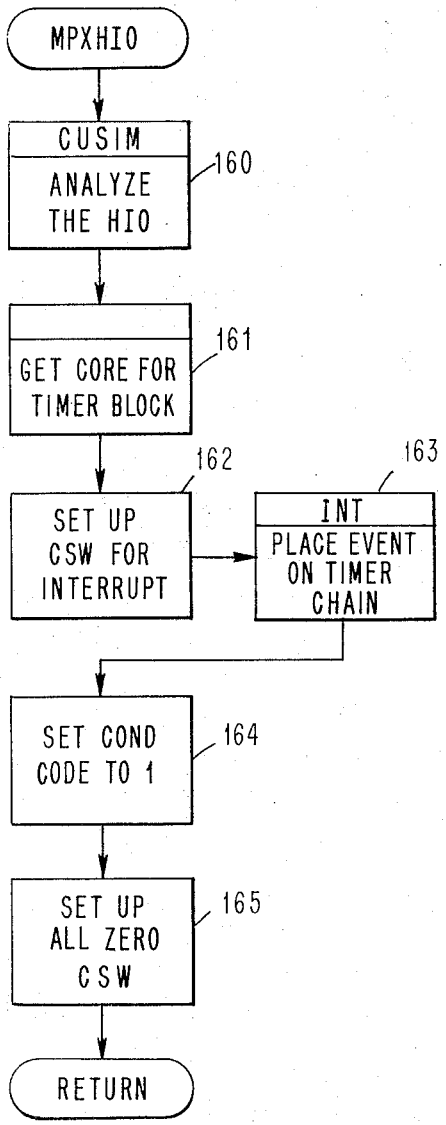
Figure 5:
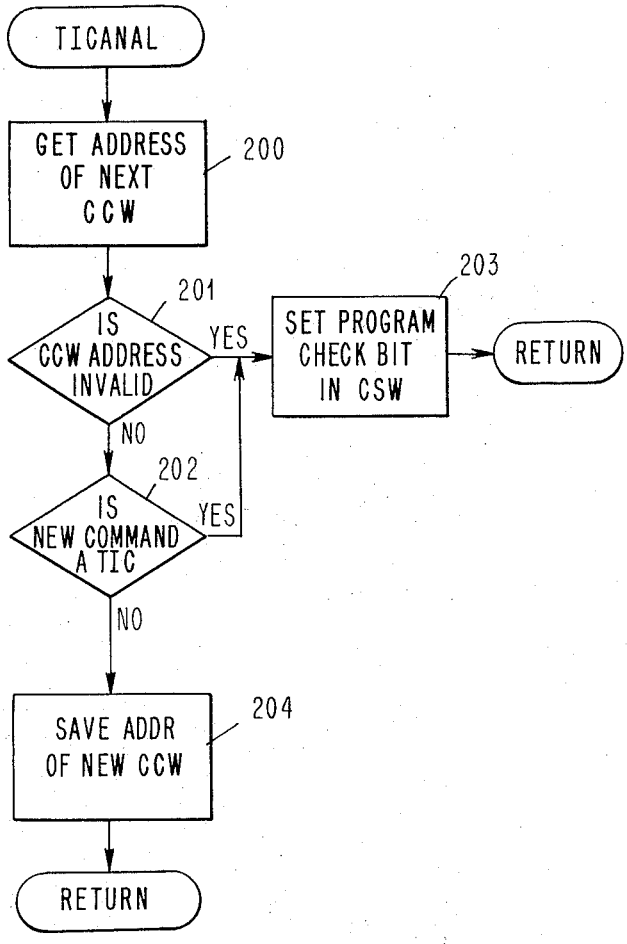

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED MARCH 5, 1974

920 O.G. 10

T920,014

MULTIPLEX CHANNEL SIMULATOR

Joanne Kraus, Staatsburg, N.Y., assignor to International Business Machines Corporation, Armonk, N.Y.

Continuation of abandoned application Ser. No. 284,844, Aug. 30, 1972. This application July 19, 1973, Ser. No. 380,930

**Int. Cl. G06f *9/12***

U.S. Cl. 444—1

6 Sheets Drawing. 18 Pages Specification

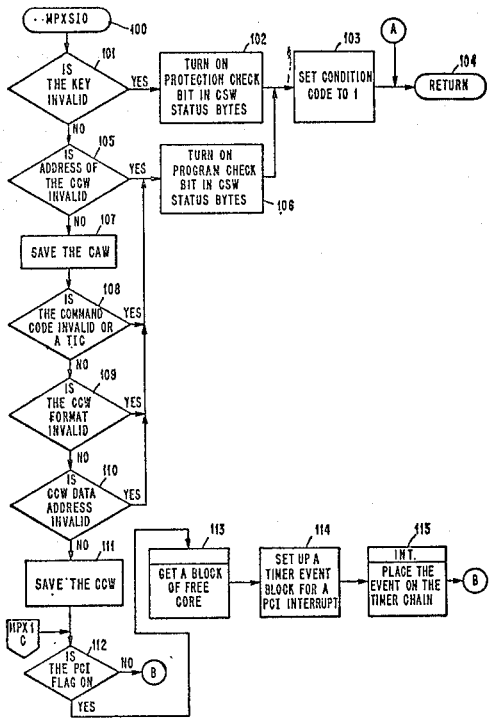

This invention is a method of operating a computer to model an IBM System/360 multiplex channel in such great detail that the timing relationships of events in a real channel are substantially maintained in the simulated channel, thus providing a method through which the simulated channel appears to simulated control unit equipment much the same as a real channel would appear to real control unit equipment, and also so that the simulated equipment appears to the control computer much the same as real equipment. With this method, new equipment to be used on an existing System/360 computer, can be simulated in order to ascertain the effect of the new equipment on the efficiency of the computer. Also, with this method, new or rewritten programs for use on yet to be installed equipment can be debugged prior to actual installation by driving the new programs over the simulated channel.

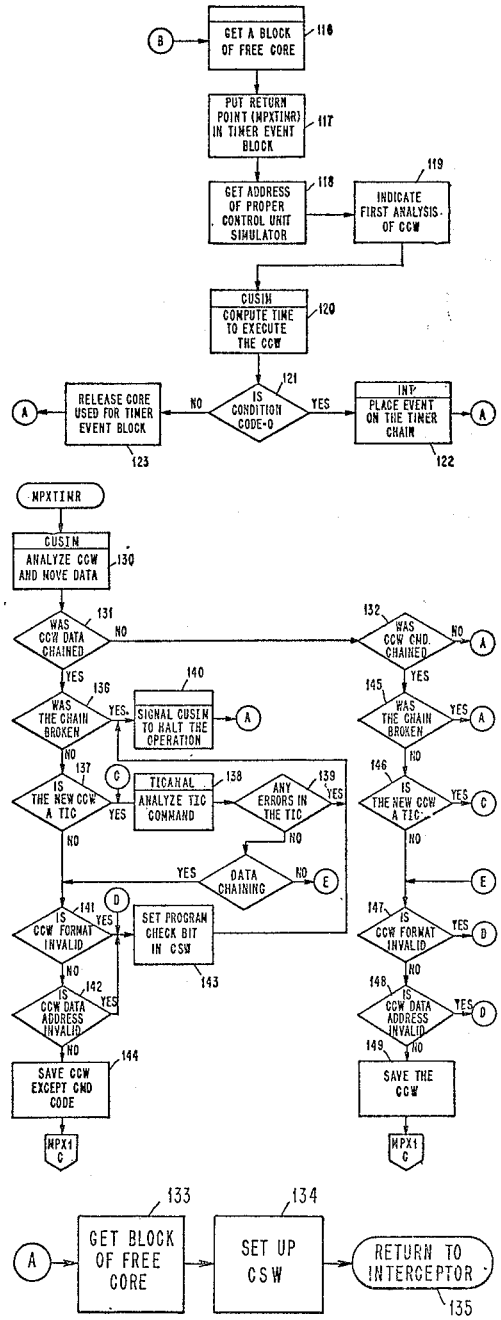

The method is comprised of the steps of intercepting Start I/O (SIO) operations, determining if they are for

MULTIPLEX CHANNEL SIMULATOR

Original Filed Aug. 30, 1972 6 Sheets-Sheet 1

MULTIPLEX CHANNEL SIMULATOR

Original Filed Aug. 30, 1972 6 Sheets-Sheet 2

MULTIPLEX CHANNEL SIMULATOR

Original Filed Aug. 30, 1972 6 Sheets-Sheet 3

MULTIPLEX CHANNEL SIMULATOR

Original Filed Aug. 30, 1972 6 Sheets-Sheet 5

MULTIPLEX CHANNEL SIMULATOR

Original Filed Aug. 30, 1972 6 Sheets-Sheet 6